US006150860A

United States Patent [19]

Chun

[11] Patent Number: 6,150,860

[45] Date of Patent: Nov. 21, 2000

[54] INTERNAL VOLTAGE GENERATOR

[75] Inventor: Jun-Hyun Chun, Cheongju, Rep. of Korea

[73] Assignee: Hyundai Electronics Industries Co., Ltd., Ichon-shi, Rep. of Korea

[21] Appl. No.: 09/453,475

[22] Filed: Dec. 2, 1999

[30] Foreign Application Priority Data

Apr. 13, 1999 [KR] Rep. of Korea ...................... 99-13001

[51] Int. Cl.[7] .............................. H03K 3/02; G05F 1/577

[52] U.S. Cl. ............................................ 327/198; 323/267

[58] Field of Search .................................... 323/266, 267, 323/282; 327/142, 143, 185, 198, 199; 365/226, 227

[56] References Cited

U.S. PATENT DOCUMENTS 5,285,409 2/1994 Hwangbo et al. ................. 365/189.12
5,517,462 5/1996 Iwamoto et al. ........................ 365/233
5,905,392 5/1999 Chun ....................................... 327/198
6,046,954 4/2000 Yoon et al. ............................. 365/226

*Primary Examiner*—Matthew Nguyen
*Attorney, Agent, or Firm*—Fleshner & Kim, LLP

[57] ABSTRACT

An internal voltage generator is disclosed. The internal voltage generator according to the present invention includes a state decoder for outputting a state signal which indicates an operation state of a semiconductor device, a clock cycle time detection unit for detecting a clocking cycle time and outputting the same, a mode decoder for decoding the operation mode and outputting a column address strobe latency, a controller for generating a driving signal and a plurality of control signals for generating an internal voltage using the outputs of the state decoder, the clock cycle time detection unit and the mode decoder, and an internal voltage generation unit for generating an internal voltage based on the driving signal and a plurality of the control signals of the controller, for thereby effectively decreasing a current consumption by selectively driving an internal voltage generation circuit based on an operation state of a semiconductor device and a current consumption variable such as a clock cycle time(tCK), a column address strobe latency, etc.

11 Claims, 7 Drawing Sheets

INTERNAL VOLTAGE GENERATOR

BACKGROUND OF THE INVENTION

1. Field of the Invention

The present invention relates to an internal voltage generation circuit, and in particular to an internal voltage generation circuit which makes it possible to decreasing a power consumption of a semiconductor device by controlling an internal voltage generation circuit in accordance with an operation state and operation parameter of a semiconductor device.

2. Description of the Background Art

As shown in FIG. 1, a conventional internal voltage generation circuit includes a state decoder 10 for generating state signals STB, ACT and SUS which indicate an operation state of a semiconductor device, a controller 20 for generating driving signals VINTA and VINTS using the state signals STB, ACT and SUS of the state decoder 10, and an internal voltage generation unit 30 for generating internal voltages Vint, Vpp and Vbb using an output of the controller 20 and an external power voltage Vext.

The internal voltage generator 30 includes a drop voltage generation unit 31 for generating a drop voltage Vint used for driving an internal circuit from the external power voltage, a boosting voltage generation unit 32 for generating a booting voltage Vpp used for driving an internal circuit from the external power voltage Vext, and a sub-voltage generation unit 33 for generating a sub-voltage Vbb used for a substrate bias of an internal circuit from the external power voltage Vext.

The generation units 31, 32 and 33 of the internal voltage generation unit 30 are each formed of a standby mode voltage driving unit having a small driving capability and an active mode voltage driving unit having a large driving capability.

FIG. 2 illustrates a detailed circuit of the drop voltage generation unit 31. As shown therein, the drop voltage generation unit 31 includes a reference voltage generation unit REFC for generating a reference voltage VREF, an active mode voltage driving unit 31A which operates in the active mode, and a standby mode voltage driving unit 31S which operates in the standby mode and clock suspending mode. Here, the active mode voltage driving unit 31A includes an active mode voltage dividing unit DIVA formed of serially connected active mode first and second resistors RA1 and RA2, an active mode differential amplifier AMPA driven by an active mode drop voltage driving signal VINTA generated based on the outputs of the state decoder 10 and the controller 20 for comparing the reference voltage VREF with a voltage divided by the voltage dividing unit DIVA, and an active mode PMOS transistor PMA having its source receiving an external voltage Vext, its drain connected with the voltage dividing unit DIVA, and its gate receiving an output of the differential amplifier AMPA. A drop voltage Vint is outputted at a commonly connected node of the voltage dividing unit DIVA and the drain of the active mode PMOS transistor PMA.

In addition, the standby mode voltage driving unit 31S includes a standby mode voltage driving unit DIVS formed of serially connected standby mode first and second resistors RS1 and RS2, a standby mode differential amplifier AMPS driven by a standby mode drop voltage driving signal VINTS based on the outputs of the state decoder 10 and the controller 20 for comparing the reference voltage VREF with the voltage divided by the voltage dividing unit DIVS, and a standby mode PMOS transistor PMS having its source receiving an external voltage Vext, its drain connected with the voltage dividing unit DIVS, and its gate receiving an output of the differential amplifier AMPS. A drop voltage Vint is outputted at the commonly connected node of the voltage dividing unit DIVS and the standby mode transistor PMS.

The operation of the conventional internal voltage generation circuit will be explained.

First, the state decoder 10 detects an operation state and outputs the state signals STB, ACT and SUS of the standby mode, active mode, and clock suspending modes. In order to control the operation of the internal voltage generation circuit, the internal voltage generation unit 30 is independently provided for the standby mode voltage generation unit and the active mode voltage generation unit in accordance with the operation state of the device, so that it is possible to effectively control the current used for the internal voltage generation circuit.

Namely, since a small amount of the current is used for the circuit which uses the internal voltage in the standby mode or the clock suspending mode, even when the driving capability of the internal voltage generation circuit and the level detection sensitivity are low, a certain problem does not occur. When the standby mode voltage generation unit which has a small consumption of the current is used, and in the active mode, the active mode voltage generation unit which has a high driving capability of the internal voltage generation circuit and a high level sensitivity.

However, in the conventional internal voltage generation circuit, since the internal voltage generation circuit is controlled only using the state(active, standby, and clock modes) of the semiconductor device, the current consumption variables are not considered except for the state modes. Therefore, it is impossible to effectively decrease the consumption of the current.

SUMMARY OF THE INVENTION

Accordingly, it is an object of the present invention to provide an internal voltage generator which is capable of effectively decreasing a current consumption by selectively driving an internal voltage generation circuit based on an operation state of a semiconductor device and a current consumption variable such as a clock cycle time(tCK), a column address strobe latency, etc.

To achieve the above objects, there is provided an internal voltage generator according to the present invention which includes a state decoder for outputting a state signal which indicates an operation state of a semiconductor device, a clock cycle time detection unit for detecting a clocking cycle time and outputting the same, a mode decoder for decoding the operation mode and outputting a column address strobe latency, a controller for generating a driving signal and a plurality of control signals for generating an internal voltage using the outputs of the state decoder, the clock cycle time detection unit and the mode decoder, and an internal voltage generation unit for generating an internal voltage based on the driving signal and a plurality of the control signals of the controller.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The embodiments of the present invention will be explained with reference to the accompanying drawings.

Figure 1:
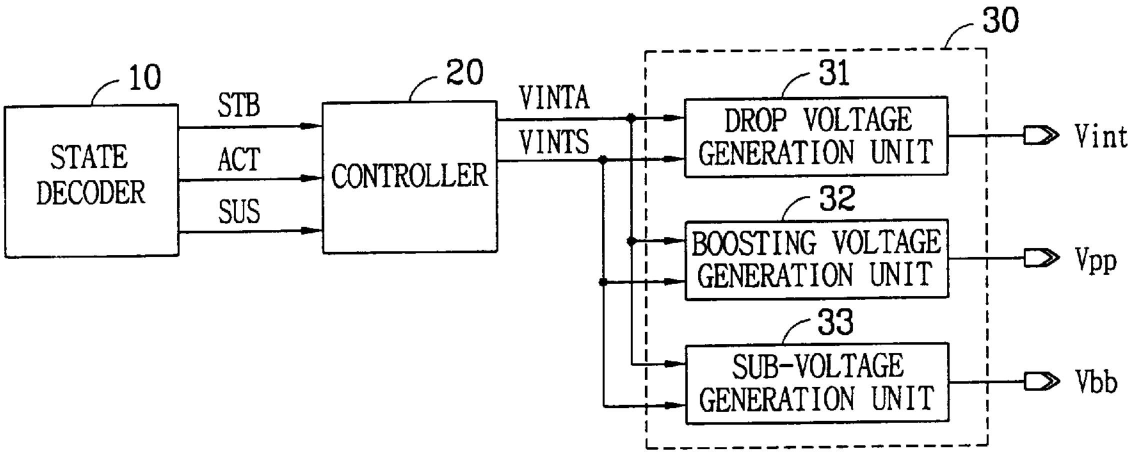
FIG. 1 CONVENTIONAL ART
FIG. 1 is a block diagram illustrating a conventional internal voltage generation circuit.
Figure 2:
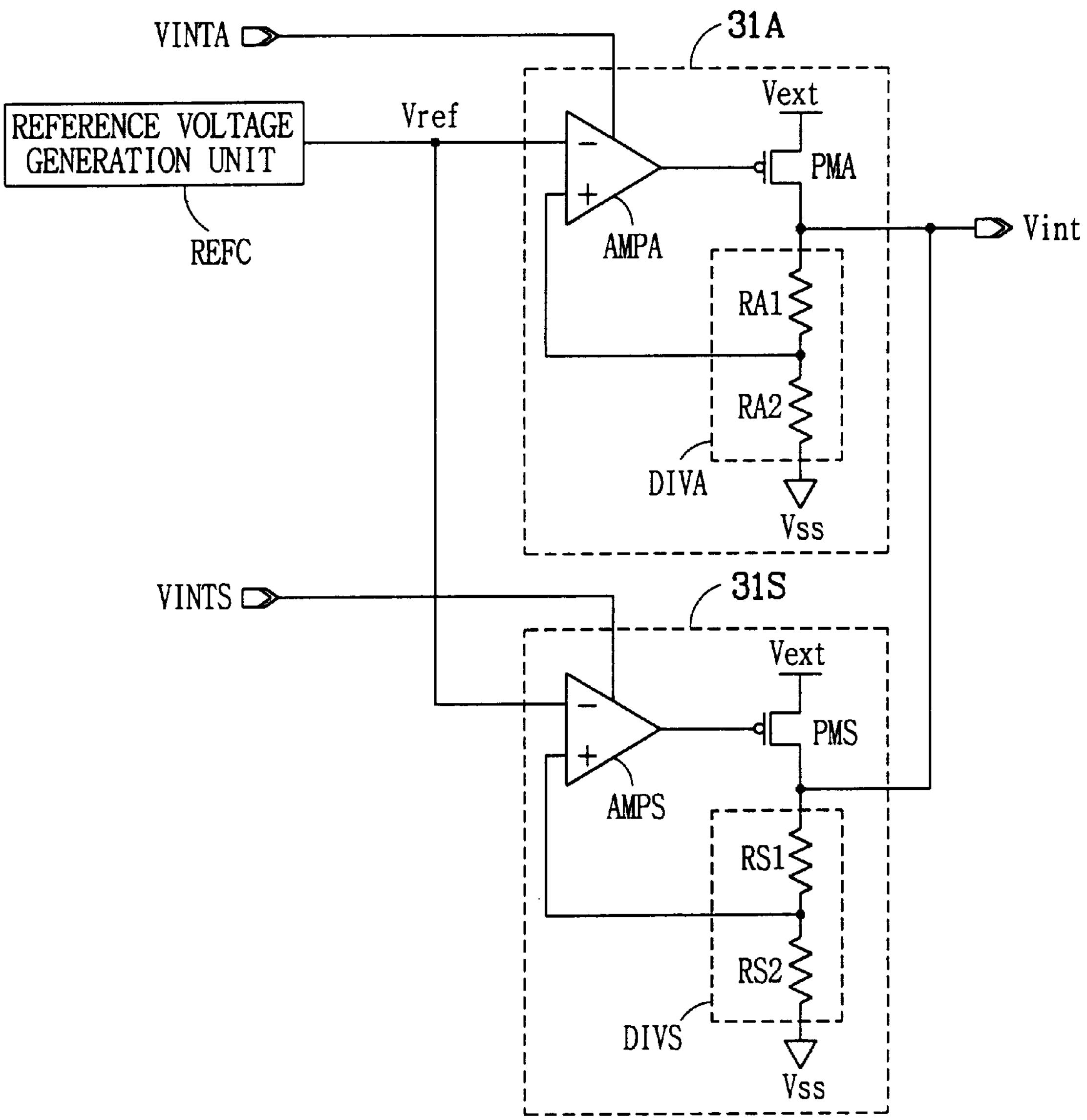
FIG. 2 CONVENTIONAL ART
FIG. 2 is a block diagram illustrating a drop voltage generation unit of FIG. 1.
Figure 3:
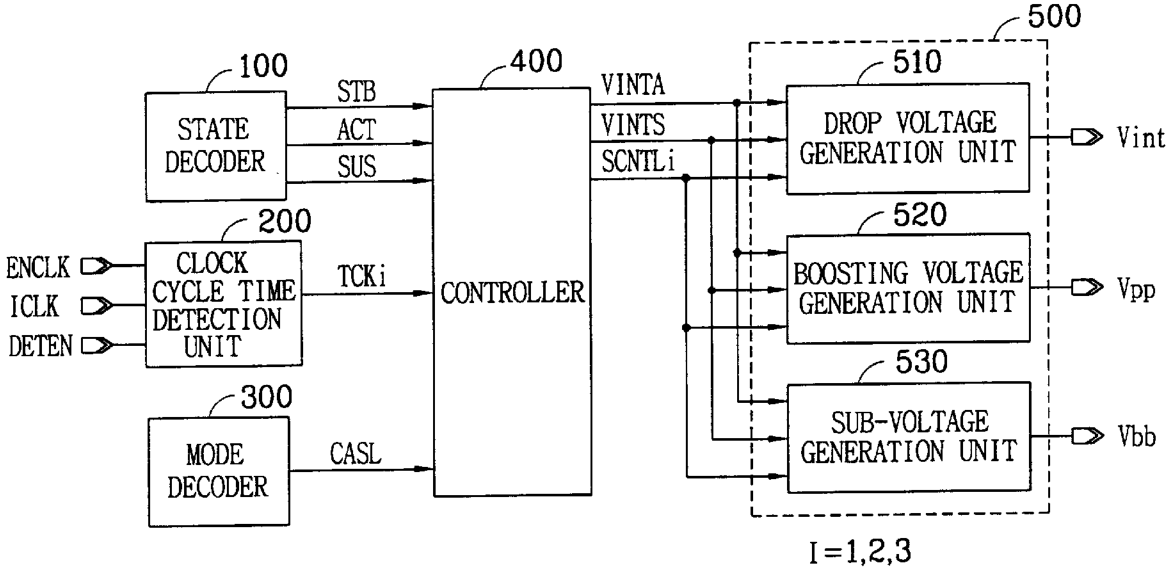
FIG. 3 is a block diagram illustrating an internal voltage generation circuit according to the present invention.

FIG. 3 is a block diagram illustrating an internal voltage generation circuit according to the present invention. The internal voltage generation circuit which is capable of detecting three clock cycle time will be explained. As shown therein, the internal voltage generation circuit according to the present invention includes a state decoder 100 for outputting state signals STB, ACT and SUS which indicate an operation state of a semiconductor device, a clock cycle time detection unit for detecting a clock cycle time tCK, a decoder 300 for decoding an operation mode and outputting a column address strobe latency CASL, a controller 400 for generating an active driving signal, standby driving signals VINTA and VINTS for controlling a circuit which generates internal voltages Vint, Vpp and Vbb using the outputs of the clock cycle time detection unit 200 and a mode decoder 300, and an internal voltage generation unit 500 for generating internal voltages Vint, Vpp and Vbb in accordance with an active driving signal, the standby driving signals VINTA and VINTS and the first through third control signals SCNTL1 through SCNTL3 of the controller 400.

Figure 4:
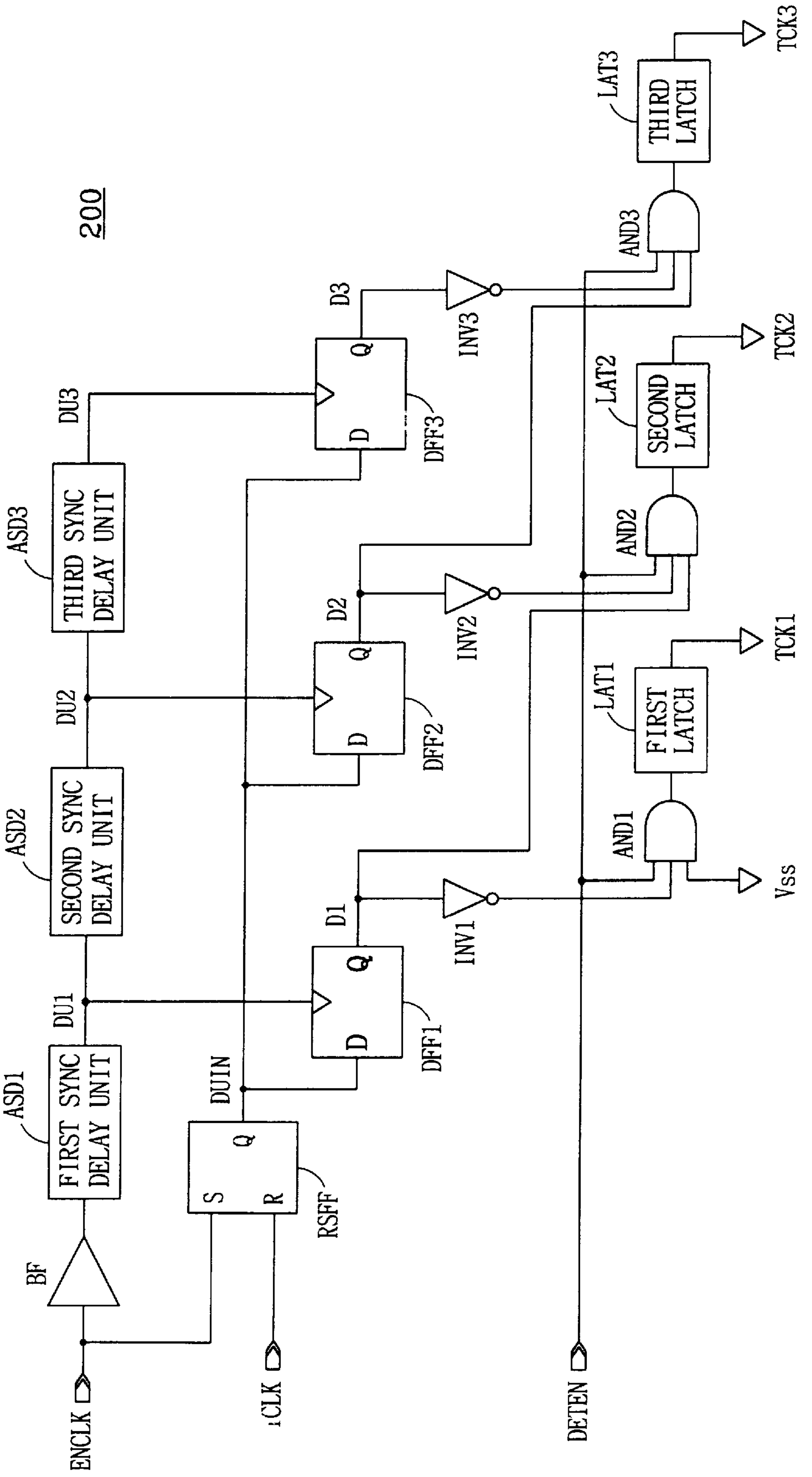
FIG. 4 is a detailed circuit diagram illustrating a clock cycle time detection unit of FIG. 3.

As shown in FIG. 4, the clock cycle time detection unit 200 includes a RS flip-flop RSFF for receiving an internal clock signal ICLK that an external clock signal CLK is buffered and a flag signal which enables the clock cycle time detection unit 200 and generating a single pulse DUIN by the clock cycle, a buffer BF for buffering the flag signal ENCLK, first through third synchronous delay units ASD1~ASD3 for sequentially digitalizing the outputs of the buffer BF, first through third D-flip-flips DFF1~DFF3 for detecting a clock cycle time tCK as the outputs DU1~DU3 of the first trough third synchronous delay units ASD1~ASD3 are inputted into the clock input terminal, respectively, first through third inverters INV1~INV3 for inverting the outputs of the first through third D-flip-flops DFF1~DFF3, a first AND gate AND1 for ANDing the output of the first inverter INV1 and a ground power voltage VSS, a second AND-gate AND2 for ANDing a pulse signal DETEC for enabling the clock cycle time detection signal, an output of the second inverter INV2 and an output of the first D-flip-flop DFF1, a third AND-gate AND3 for ANDing a pulse signal DETEC for enabling the clock cycle time detection signal, an output of the third inverter INV3 and an output of the second D-flip-flop DFF2, and first through third latches LAT1~LAT3 for outputting first through third clock cycle detection signals tCK1~tCK3 by latching the outputs of the first through third AND-gates AND1~AND3.

The internal voltage generation unit 500 includes a drop voltage generation unit 510 for generating a drop voltage Vint, which is used for driving an internal circuit, from an external power voltage Vext, a boosting voltage generation unit 520 for generating a boosting voltage Vpp, which is used for driving an internal circuit, from the external power voltage Vext, and a sub-voltage generation unit 530 for generating a sub-voltage Vbb, which is used for a substrate bias of an internal circuit, from the external power voltage Vext. Here, The generation units 510~530 of the internal voltage generation unit 500 each is formed of a standby mode voltage generation unit having a small driving capability and an active mode voltage generation unit having a large driving capability for decreasing the power consumption.

Figure 6:
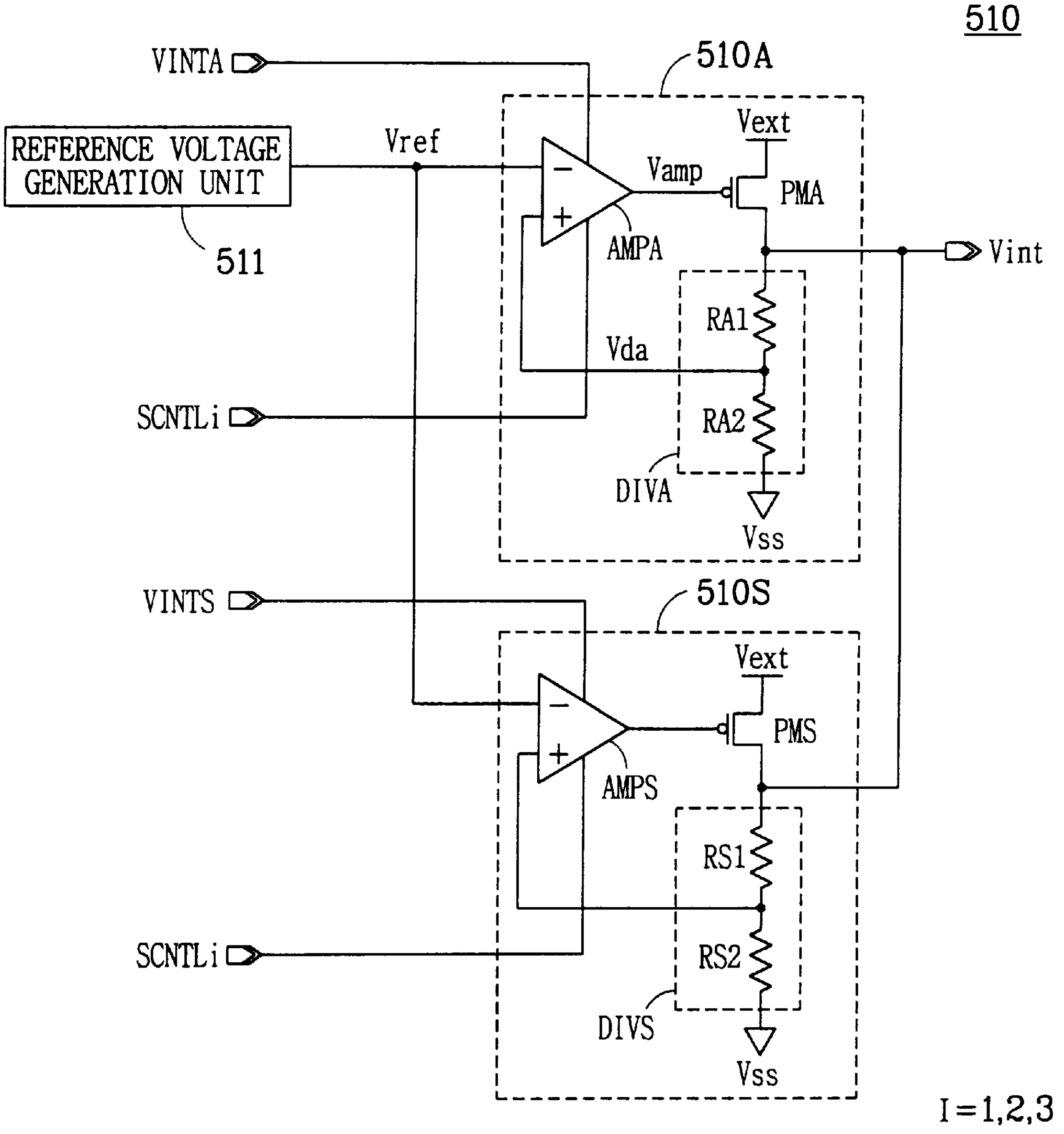
FIG. 6 is a detailed circuit diagram illustrating a drop voltage generation unit of FIG. 3.

FIG. 6 is a detailed circuit diagram illustrating the drop voltage generation unit 510. As shown therein, the drop voltage generation unit 510 includes a reference voltage generation unit 511 for generating a reference voltage VREF, an active mode driving unit 510A which operates in the active mode, and a standby mode driving unit 510S which operates in the standby mode and clock suspended mode. Here, the active mode driving unit 510A includes an active mode voltage dividing unit DIVA formed of serially connected active mode first and second resistors RA1 and RA2, an active mode differential amplifier AMPA driven by an active mode drop voltage driving signal VINTA generated by the state decoder 100 and the internal voltage generation circuit controller 200 and controlled by a control signal SCNTL for comparing the reference voltage VREF and the voltage dividing unit DIVA, and an active mode PMOS transistor PMA having its source receiving an external voltage Vext, its drain connected with the voltage dividing unit DIVA, and its gate receiving an output of the differential amplifier AMPA, whereby a drop voltage Vint is outputted at the node in which the voltage dividing unit DIVA and the drain of the PMOS transistor PMA are commonly connected.

The standby mode driving unit 510S includes a standby mode voltage dividing unit DIVS formed of serially connected first and second registers RS1 and RS2, a standby mode differential amplifier AMPS driven by a standby mode drop voltage driving signal VINTS generated by the state decoder 100 and the internal voltage generation circuit controller 200 and controlled by the control signal SCNTL for comparing the reference voltage VREF with the voltage divided by the voltage driving unit DIVS, and a standby mode PMOS transistor PMS having its source receiving an external voltage Vext, its drain connected with the voltage dividing unit DIVS, and its gate receiving an output of the differential amplifier AMPS, whereby a drop voltage Vint is outputted at the node in which the voltage dividing unit DIVS and the drain of the PMOS transistor are commonly connected.

Figure 7:
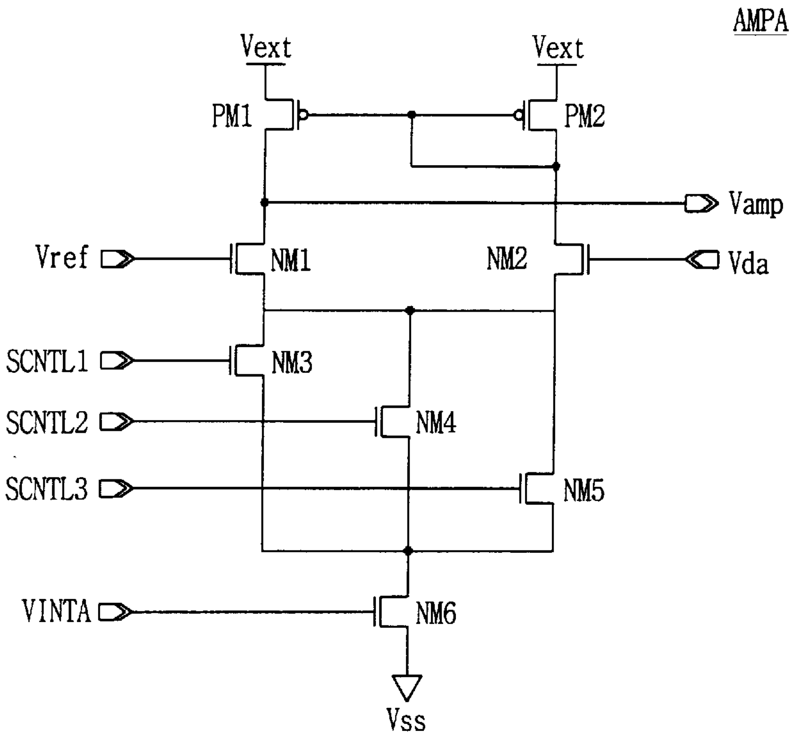
FIG. 7 is a detailed circuit diagram illustrating an active differential amplifier of FIG. 6.

FIG. 7 is a circuit diagram illustrating the active mode differential amplifier AMPA of the drop voltage generation unit 510 which includes a first PMOS transistor PM1 having its source receiving an external voltage Vext, a second PMOS transistor PM2 having its source receiving an external voltage Vext and its commonly connected gate and drain connected with the gate of the first PMOS transistor PM1, a first NMOS transistor NM1 having its gate receiving a reference voltage VREF and its drain connected with the drain of the first PMOS transistor PM1, a second NMOS transistor NM2 having its gate receiving an output Vda of the active mode voltage dividing unit DIVA and its drain connected with the drain of the second PMOS transistor PM2, third through fifth NMOS transistors NM3~NM5 and their sources connected with the commonly connected drains of the first and second NMOS transistors NM1 and NM2 and their gates receiving first through third control signals SCNTL1~SCNTL3, and a sixth NMOS transistor NM6 having its source connected with the commonly connected drain of the third through fifth NMOS transistors NM3~NM5, its drain connected with a ground power voltage VSS, and its gate receiving an active mode driving signal VINTA, whereby an output signal VBamp is outputted at the node in which the drains of the first PMOS transistor PM1 and the first NMOS transistor NM1 are commonly connected. In addition, the construction of the standby mode differential amplifier AMPS is the same as the active mode differential amplifier AMPA.

The operation of the internal voltage generation circuit according to the present invention will be explained with reference to the accompanying drawings.

First, in the internal voltage generation circuit according to the present invention, the internal voltage generation controller 400 receives the state signals STB, ACT and SUS generated by the state decoder 100, the clock cycle time detection signals tCK1~tCK3 detected by the clock cycle time detection unit 200, and a column address strobe latency CASL generated by the mode decoder 300 for thereby controlling the internal voltage generation unit 500.

The internal voltage generation unit 500 is formed of standby and active mode internal voltage generation units which are independently controlled in accordance with the operation state in the same manner as the conventional art. Namely, in the case that the state of the semiconductor device is in the standby mode or in the clock stop mode, the driving capability is small, and the level sensitivity is low, so that the response time is slow. Therefore, when driving the internal voltage generation circuit, the standby mode driving unit which operates by a small amount of the current is drive. In the active mode, since the driving capability is large, and the level sensitivity is high, the active mode driving unit which operates at a rapid response time is driven.

Figure 8:
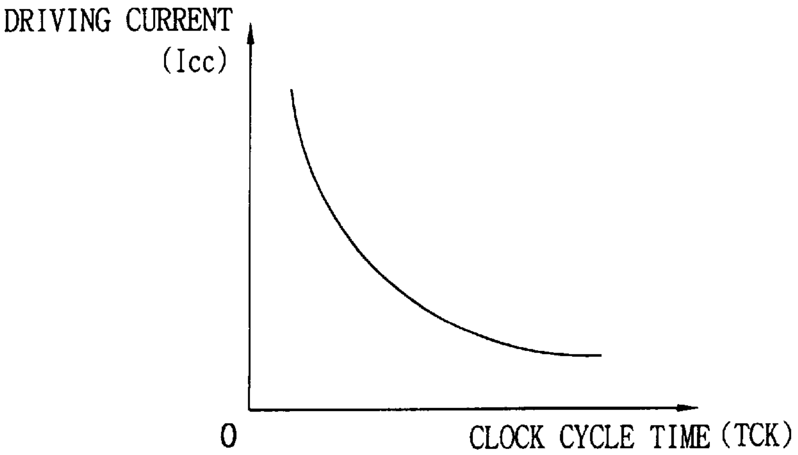
FIG. 8 is a graph illustrating an interrelationship between a clock cycle time and a driving current of FIG. 3.

As shown in FIG. 8, in the consumption characteristic of the driving current(ICC) for the semiconductor device based on the clock cycle time tCK, as the clock cycle time tCK is increased, the driving current ICC of the semiconductor device is decreased.

Figures 5A, 5B, 5C, 5D, 5E, 5F, 5G, 5H, 5I, 5J, 5K, 5L, 5M, 5N:
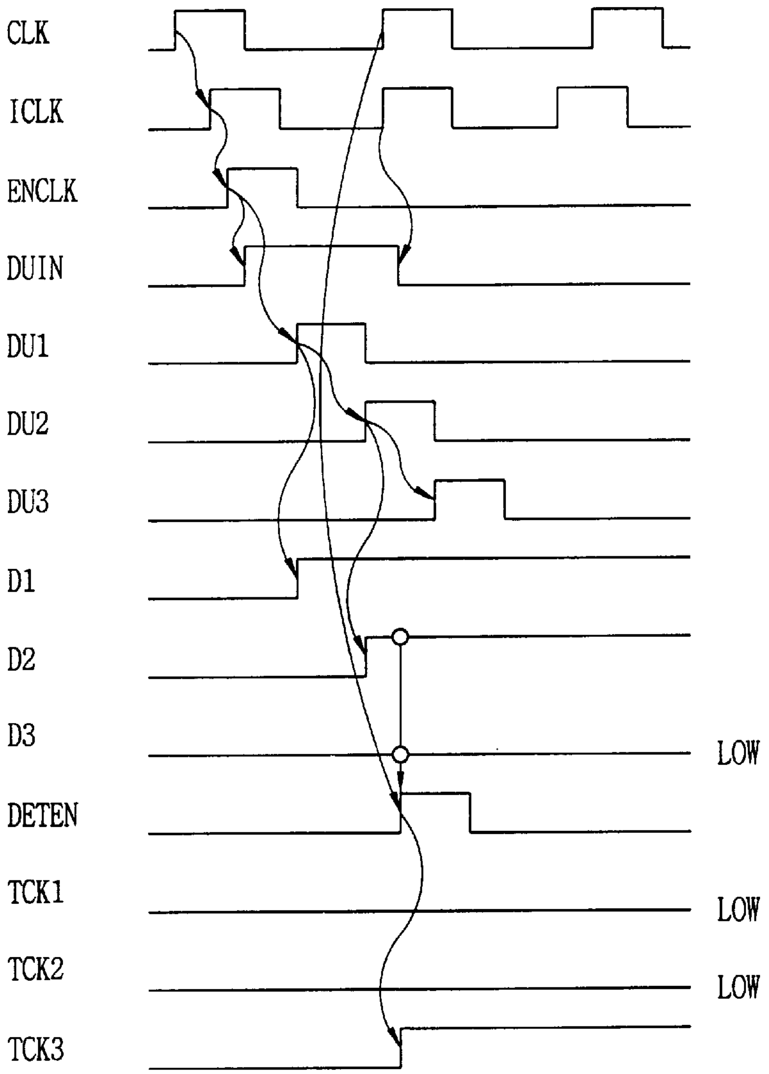
FIGS. 5A through 5N are views illustrating an operation timing of a clock cycle time detection unit of FIG. 4.

As shown in FIG. 8, in the clock cycle mode detection unit 300 according to the present invention, the consumption characteristic of the driving current(ICC) of the semiconductor device based on the clock cycle time tCK is adapted to the internal voltage generation circuit. The clock cycle time tCK is detected based on the timing diagrams as shown in FIGS. 5A~5N, and the internal voltage generation circuit is controlled using the thusly detected signal(the third clock cycle time detection signal tCK3). Namely, if the clock cycle time tCK is small, the driving capabilities of the active and standby mode driving units of the generation units 510~530 are increased, and if the clock cycle time tCK is large, the driving capability is decreased. The characteristics of the third through fifth NMOS transistors NM3~NM5 may be differently set, and the characteristics of the clock cycle time detection signals tCK1~tCK3 may be differently set.

The clock cycle time detection unit 200 may be operated when the operation of the same is needed, so that the use of the current used by the clock cycle time detection unit 200 is restricted. Namely, when the column address strobe latency CASL which is an output of the mode decoder 200 is 1, the driving capabilities of the active and standby mode driving units of the internal voltage generation units 510~530 are controlled to be minimized. If the column address strobe latency CASL is 1, since the clock cycle time tCK is increased, the consumption of the current is small, so that the current decreasing function which uses the clock cycle time detection unit 200 is not used.

On the contrary, if the column address strobe latency CASL is 0, the driving capabilities of the active and standby mode driving units are increased.

The above-described operation is implemented by the internal voltage generation controller 400. When the clock cycle time detection signals tCK1~tCK3 and column address strobe latency CASL from the clock cycle time detection unit 200 and the mode decoder 300 are inputted, the internal voltage generation controller 400 outputs the first through third control signals SCNTL1~SCNTL3 and controls the internal voltage generation unit 500.

The first through third control signals SCNTL1~SCNTL3 are inputted into the third through fifth NMOS transistors NM3~NM5 of the active and standby mode differential amplifiers AMPA and AMPS which form each of the generation units 510~530 of the internal voltage generation unit 500. At this time, the driving capabilities of the generation units 510~530 are controlled by controlling the timing of the first through third control signals SCNTL1~SCNTL3 and the characteristics of the third through fifth NMOS transistors NM3~NM5 for thereby decreasing the power consumption.

As described above, the internal voltage generation circuit according to the present invention is controlled based on the operation state as well as other current consumption characteristics such as a clock cycle time tCK and a column address strobe latency for thereby decreasing the consumption of the current.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. An internal voltage generation circuit, comprising:

a state decoder for outputting a state signal which indicates an operation state of a semiconductor device;

a clock cycle time detection unit for detecting a clocking cycle time and outputting the same;

a mode decoder for decoding the operation mode and outputting a column address strobe latency;

a controller for generating a driving signal and a plurality of control signals for generating an internal voltage using the outputs of the state decoder, the clock cycle time detection unit and the mode decoder; and an internal voltage generation unit for generating an internal voltage based on the driving signal and the plurality of the control signals of the controller.

2. The circuit of claim 1, wherein said clock cycle time detection unit includes:

a RS flip-flop for receiving an internal clock signal that an external clock signal is buffered and a flag signal which enables the clock cycle time detection unit and generating a single pulse by a clock period;

a plurality of synchronous delay units for digitalizing the flag signal;

a plurality of flip-flops each having a data input terminal which receives an output of the RS flip-flop and a clock input terminal which receives the outputs of the clock input terminals for thereby detecting a clock cycle time;

a plurality of inverters for inverting the outputs of the flip-flops;

a plurality of AND-gates each having a first input terminal which receives a pulse signal for enabling the clock cycle time detection unit, a second input terminal which receives the outputs of the inverters and a third input terminal which receives the outputs of the flip-flops for thereby ANDing the thusly received outputs; and a plurality of latches for latching the outputs of the AND-gates and outputting a plurality of clock cycle detection signals.

3. The circuit of claim 1, wherein said internal voltage generation unit includes:

a drop voltage generation unit for generating a drop voltage used for driving an internal circuit from an external power voltage;

a boosting voltage generation unit for generating a boosting voltage used for driving an internal circuit from an external power voltage; and a sub-voltage generation unit for generating a sub-voltage used for a substrate bias of an internal circuit from an external power voltage.

4. The circuit of claim 3, wherein each generation unit of the internal voltage generation units includes a reference voltage generation unit for generating a reference voltage, a standby mode voltage generation unit having a smaller driving capability, and an active mode voltage generation unit having a larger driving capability.

5. The circuit of claim 3, wherein said active mode driving unit and standby mode driving unit for the drop voltage generation unit each includes:

a voltage diving unit for the inputted voltage at a certain ratio;

a differential amplifier driven by a driving signal and a plurality of control signals from the controller and controlled by the driving signal and the control signals for comparing a reference voltage with the voltage divided by the voltage dividing unit; and a PMOS transistor having its source receiving an external voltage, its drain connected with the voltage dividing unit and its gate receiving an output of the differential amplifier, whereby a drop voltage it outputted at a node in which the voltage dividing unit and the drain of the PMOS transistor are commonly connected.

6. The circuit of claim 5, wherein each of said devices which form the active mode driving unit of the drop voltage generation unit has a characteristic for increasing the driving capability, and each of said devices which form the standby mode driving unit has a characteristic for decreasing the driving capability.

7. The circuit of claim 5, wherein said differential amplifier of the driving unit of the drop voltage generation unit includes:

a first PMOS transistor having it source receiving an external power voltage;

a second PMOS transistor having its source receiving an external power voltage and its commonly connected gate and drain connected with the gate of the first PMOS transistor;

a first NMOS transistor having its gate receiving the reference voltage and its drain connected with the drain of the first PMOS transistor;

a second NMOS transistor having its gate receiving an output of the voltage dividing unit and its drain connected with the drain of the second PMOS transistor;

a plurality of NMOS transistors having their sources connected with the commonly connected drain of the first and second NMOS transistors and their gates receiving the control signals; and a third NMOS transistor having its source connected with the commonly connected drains of the NMOS transistors, its drain connected with a ground power voltage, and its gate receiving a driving signal, whereby an output signal is outputted at the commonly connected drains of the first PMOS transistor and the first NMOS transistor.

8. The circuit of claim 7, wherein the plurality of said control signals of the differential amplifiers have the same characteristics, and the plurality of said NMOS transistors have different characteristics, respectively.

9. The circuit of claim 7, wherein the plurality of said control signals of the differential amplifiers have different characteristics, respectively, and the plurality of said NMOS transistors have the same characteristics, respectively.

10. The circuit of claim 1, wherein the plurality of said control signals are generated using the clock cycle time detection signal detected by the clock cycle mode detection unit and have a large driving capability of the active and standby mode driving units of each generation unit when the clock cycle time is small and have a small driving capability when the clock cycle time is small.

11. The circuit of claim 1, wherein said mode decoder is operated only when the clock cycle time detection unit needs the operation of the same.

* * * * *